(12) United States Patent
Shu et al.

(10) Patent No.: US 9,836,236 B2
(45) Date of Patent: *Dec. 5, 2017

(54) SPI INTERFACE ENHANCED FLASH CHIP AND CHIP PACKAGING METHOD

(71) Applicant: GIGADEVICE SEMICONDUCTOR (BEIJING) INC., Beijing (CN)

(72) Inventors: Qingming Shu, Beijing (CN); Hong Hu, Beijing (CN); Sai Zhang, Beijing (CN); Jianjun Zhang, Beijing (CN); Jiang Liu, Beijing (CN); Ronghua Pan, Beijing (CN)

(73) Assignee: GIGADEVICE SEMICONDUCTOR (BEIJING) INC., Beijing (CN)

( * ) Notice: Subject to any disclaimer, the term of this patent is extended or adjusted under 35 U.S.C. 154(b) by 361 days.

This patent is subject to a terminal disclaimer.

(21) Appl. No.: 14/412,205

(22) PCT Filed: Jul. 15, 2013

(86) PCT No.: PCT/CN2013/078853
§ 371 (c)(1),
(2) Date: Dec. 31, 2014

(87) PCT Pub. No.: WO2014/166172
PCT Pub. Date: Oct. 16, 2014

(65) Prior Publication Data
US 2015/0186067 A1 Jul. 2, 2015

(30) Foreign Application Priority Data
Apr. 9, 2013 (CN) .......................... 2013 1 0121611

(51) Int. Cl.
G11C 5/06 (2006.01)
G06F 3/06 (2006.01)
(Continued)

(52) U.S. Cl.
CPC ............ *G06F 3/0626* (2013.01); *G06F 3/061* (2013.01); *G06F 3/0659* (2013.01);
(Continued)

(58) Field of Classification Search
CPC ...... G06F 3/0626; G06F 3/061; G06F 3/0659; G06F 3/0688; H01L 25/50
(Continued)

(56) References Cited

U.S. PATENT DOCUMENTS 9,396,798 B2 * 7/2016 Hu .......................... H01L 24/45
2003/0163656 A1 8/2003 Ganton
(Continued)

FOREIGN PATENT DOCUMENTS

CN 102254891 A 11/2011
CN 102820302 A 12/2012
(Continued)

*Primary Examiner* — Pho M Luu
(74) *Attorney, Agent, or Firm* — Gokalp Bayramoglu

(57) ABSTRACT

An enhanced Flash chip of SPI interface and a method for packaging chip, to solve the problems of high design complexity, long design period and high design cost. The chip comprises SPI FLASH and RPMC which are packaged integrally; the SPI FLASH and the RPMC comprise an independent controller, respectively; the same IO pins in SPI FLASH and RPMC are mutually connected and are connected to the same external sharing pin of the chip. The SPI FLASH and the RPMC further comprise an internal IO pin, respectively, in which the internal IO pin of SPI FLASH is connected with the internal IO pin of RPMC, and the internal mutual communication between the SPI FLASH and the RPMC is achieved through the mutually connected internal IO pins. Thus, it is possible to reduce the package size, decrease the cost of design, shorten design period and improve chip performance.

15 Claims, 2 Drawing Sheets

(51) Int. Cl.
*H01L 25/00* (2006.01)
*G06F 13/42* (2006.01)
*H01L 23/00* (2006.01)

(52) U.S. Cl.
CPC ........ *G06F 3/0688* (2013.01); *G06F 13/4291* (2013.01); *H01L 25/50* (2013.01); *H01L 24/06* (2013.01); *H01L 24/32* (2013.01); *H01L 24/45* (2013.01); *H01L 24/48* (2013.01); *H01L 24/73* (2013.01); *H01L 2224/04042* (2013.01); *H01L 2224/05554* (2013.01); *H01L 2224/06135* (2013.01); *H01L 2224/32145* (2013.01); *H01L 2224/45144* (2013.01); *H01L 2224/48137* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06568* (2013.01); *H01L 2924/1438* (2013.01)

(58) Field of Classification Search
USPC .......................................................... 365/63
See application file for complete search history.

(56) References Cited

U.S. PATENT DOCUMENTS

2015/0348939 A1\* 12/2015 Hu .......................... H01L 25/50
                                                                 711/103
2016/0180095 A1\*  6/2016 Sarangdhar ........... G06F 21/575
                                                                 713/2

FOREIGN PATENT DOCUMENTS

CN           103258821  A       12/2012
CN           103258821  A        8/2013

\* cited by examiner

SPI INTERFACE ENHANCED FLASH CHIP AND CHIP PACKAGING METHOD

RELATED APPLICATIONS

This application is related to the co-pending U.S. patent application Ser. No. 14/760,207, filed on Jul. 10, 2015; and U.S. patent application Ser. No. 14/647,092, filed on May 25, 2015 which matured into U.S. Pat. No. 9,396,798.

TECHNICAL FIELD

The present application relates to the field of chip technology, and especially to an enhanced Flash chip of SPI interface and a method for packaging chip.

BACKGROUND OF THE INVENTION

The enhanced Flash (one type of memory chip) comprising RPMC (Replay Protection Monotonic Counter) is a featured BIOS (Basic Input-Output System) chip launched by Intel. It comprises a SPI (Serial Peripheral Interface) Flash chip having large capacity and a RPMC circuit. The capacity of SPI FLASH chip can be 8 M, 16 M, 32 M, 64 M, 128 M, 256 M or more in which codes and data of CPU (Central Processing Unit) and BIOS are stored; RPMC circuit may guarantee the security and integrity of reading and writing data. The RPMC circuit and the SPI FLASH integrated therein constitute the hardware platform of the BIOS of PC (Personal Computer) system.

At present, when designing the enhanced Flash chip with RPMC function, a designer usually integrates the SPI Flash having large capacity and RPMC into a single chip, which means that the RPMC circuit and the SPI FLASH are designed together.

However, such a design manner has the following disadvantages: since the SPI FLASH and the RPMC are required to be integrated into a single chip, the single chip has a large size and a package thereof has a large size, causing an expensive cost; and the RPMC and the SPI FLASH are designed together, resulting in a complexity and a long period of chip design.

SUMMARY OF THE INVENTION

One of the objectives of the present invention is to provide an enhanced Flash chip of SPI interface and a method for packaging chip to solve the problems of high design complexity, long design period and high design cost.

In order to solve above problems, the present invention provides an enhanced Flash chip of SPI interface, which comprises:
SPI FLASH and RPMC which are packaged integrally, wherein,
the SPI FLASH and the RPMC comprise an independent controller, respectively;
the same IO pins in the SPI FLASH and in the RPMC are mutually connected and are connected to the same external sharing pin of the chip, the external sharing pin comprising: a CSB, a SCLK, aSI, a WPB, a HOLDB and a SO, in which the CSB, SCLK, SI and SO are pins of SPI interface and the WPB and HOLDB are extended pins of SPI interface;
an external instruction is transmitted to the SPI FLASH and the RPMC through CSB, SCLK and SI of the external sharing pins of the chip and the controller of SPI FLASH and the controller of RPMC judge whether to execute the external instruction, respectively; and the SPI FLASH and the RPMC further comprise an internal IO pin, respectively, in which the internal IO pin of the SPI FLASH is connected with the same internal IO pin of the RPMC, and the internal mutual communication between the SPI FLASH and the RPMC is achieved through the mutually connected internal IO pins.

Preferably, when the chip receives a first external instruction through CSB, SCLK and SI of the external sharing pins, if the controller of SPI FLASH and the controller of RPMC judge that the SPI FLASH and the RPMC both are required to execute the first external instruction, respectively, then the SPI FLASH and the RPMC execute a corresponding operation according to the first external instruction, respectively; if either one of the SPI FLASH and the RPMC is required to execute the first external instruction, then when one of the SPI FLASH and the RPMC executes the corresponding operation according to the first external instruction, if the chip receives a second external instruction through the external sharing pins which needs to be executed by the other one of the SPI FLASH and the RPMC, then the other one of the SPI FLASH and the RPMC executes a corresponding operation according to the second external instruction.

Preferably, when the SPI FLASH is executing the external instruction and the RPMC is idle, if the chip receives a suspend instruction through the external sharing pins, then the controller of the SPI FLASH judges that the SPI FLASH is required to execute the suspend instruction, the controller of the RPMC judges that RPMC is not required to execute the suspend instruction; and
after suspending the operation being executed according to the suspend instruction, the SPI FLASH sends a notification of its suspension to the RPMC through the pair of mutually connected internal IO pins, and after receiving the notification, the RPMC executes the suspend instruction to realize synchronization with the SPI FLASH.

Preferably, a clock signal is transmitted to the SPI FLASH and the RPMC through SCLK of the chip, and the controller of SPI FLASH and the controller of RPMC determine a clock cycle according to the clock signal, respectively; and a chip select signal is transmitted to the SPI FLASH and the RPMC through CSB of the chip according to the determined clock cycle, a control instruction is transmitted to the SPI FLASH and the RPMC through SI of the chip according to the determined clock cycle, and the controller of SPI FLASH and the controller of RPMC determine to execute process operation corresponding to the instruction in the SPI FLASH and the RPMC according to the control instruction, respectively.

Preferably, the SPI FLASH further comprises an independent IO pin connected with the SPI FLASH to realize its function, and the independent IO pin connected with SPI FLASH is connected to the external independent pin of the chip; and
the RPMC further comprises an independent IO pin connected with RPMC to realize its function, and the independent IO pin connected with RPMC is connected to other external independent pin of the chip,
wherein, the independent IO pin connected with SPI FLASH the independent IO pin connected with RPMC is not mutually connected.

Preferably, the same IO pins of the SPI FLASH and the RPMC being mutually connected=and being connected to the same external sharing pins of the chip, comprises:
an IO pin a_x of the SPI FLASH is connected with the same IO pin b_y of the RPMC and the IO pin a_x of the SPI FLASH is connected to the same external sharing pin PAD_z of the chip, or the same IO pin b_y of the RPMC is connected to the same external sharing pin PAD_z of the chip;

wherein, "a" indicates an IO pin of SPI FLASH, "x" indicates an IO pin mark of SPI FLASH; "b" indicates an IO pin of RPMC and "y" indicates an IO pin mark of RPMC; "PAD" indicates an IO pin of chip package and "z" indicates an IO pin mark of chip package.

Preferably, a plurality of the pairs of mutually connected internal IO pins are provided; and a plurality of the external independent pins of the chip are provided.

The present invention also provides a method for packaging chip, comprising steps of:

placing SPI FLASH and RPMC to be packaged onto a chip carrier, the SPI FLASH and the RPMC being mutually independent;

mutually connecting the same IO pins in the SPI FLASH and in the RPMC by using metal wires;

connecting the mutually connected same IO pins to the same external sharing pin of the chip carrier using the metal wires, the external sharing pin comprising: a chip select CSB, a serial clock SCLK, a serial data input SI, a write protection WPB, an external instruction shield HOLDB and a serial data output SO, wherein the CSB, SCLK, SI and SO are pins of the SPI interface, and the WPB and HOLDB are extended pins of the SPI interface;

mutually connecting an internal IO pin of the SPI FLASH and an internal IO pin of the RPMC by using the metal wires; and performing plastic package on the SPI FLASH, the RPMC and the chip carrier to form an enhanced Flash chip with functions of RPMC.

Preferably, the method further comprises:

connecting an independent IO pin of the SPI FLASH for realizing the function of SPI FLASH to an external independent pin of the chip carrier by using the metal wires; and connecting an independent IO pin of the RPMC for realizing the function of RPMC to another external independent pin of the chip carrier by using the metal wires, wherein, the independent IO pin of the SPI FLASH is not connected with the independent IO pin of the RPMC.

Preferably, the step of connecting the mutually connected same IO pins to the same external sharing pin of the chip carrier by using the metal wires, comprises:

connecting an IO pin a_x of the SPI FLASH to the same external sharing pin PAD_z of the chip carrier by using the metal wires, or connecting the same IO pin b_y of the RPMC to the same external sharing pin PAD-z of the chip carrier by using the metal wires, wherein, the IO pin a_x of the SPI FLASH and the IO pin b_y of the RPMC are the mutually connected same IO pins; and "a" indicates an IO pin of SPI FLASH, "x" indicates an IO pin mark of SPI FLASH; "b" indicates an IO pin of RPMC and "y" indicates IO pin mark of RPMC; "PAD" indicates an IO pin of chip package and "z" indicates an IO pin mark of chip package.

Preferably, the step of placing SPI FLASH and RPMC to be packaged onto a chip carrier, comprises:

placing the SPI FLASH and the RPMC onto the chip carrier side by side, or vertically stacking the SPI FLASH and the RPMC on the chip carrier;

when the SPI FLASH and the RPMC are vertically stacked on the chip carrier, if the size of the SPI FLASH is larger than that of the RPMC, then the RPMC is vertically stacked on the SPI FLASH; and if the size of the RPMC is larger than of the SPI FLASH, the SPI FLASH is vertically stacked on the RPMC.

The present invention also provides a computer readable recording medium in which a program used to execute the method is recorded.

Compared with the prior art, the present invention has the following advantages:

1. The enhanced Flash chip of SPI interface proposed by the embodiments of the present invention is to integrally package SPI FLASH and RPMC, wherein, the SPI FLASH circuit and the RPMC circuit comprise an independent controller, respectively the same IO pins of the SPI FLASH and the RPMC are mutually connected, and connected to the same external sharing pin of the chip; the external sharing pin comprises: a chip select (CSB), a serial clock (SCLK), a serial data input (SI), a write protection B (WPB), an external instruction shield (HOLDB) and a serial data output (SO), in which the CSB, SCLK. SI and SO are pins of SPI interface, and the WPB and HOLDB are extended pins of SPI interface; an external instruction is transmitted to the SPI FLASH and the RPMC through CSB, SCLK and SI of the external sharing pins of the chip and the controller of SPI FLASH and the controller of RPMC judge whether to execute the external instruction, respectively; and the SPI FLASH and the RPMC further comprise an internal IO pin, respectively, in which the internal IO pin of the SPI FLASH is connected with the same internal IO pin of the RPMC, and the internal mutual communication between the SPI FLASH and the RPMC is achieved through the pair of mutually connected internal IO. In the embodiments of the present invention, since the SPI FLASH and the RPMC are packaged integrally, the package size and the design cost can be reduced; moreover, since the existing SPI FLASH chips can be reused as the circuit modules of SPI FLASH and the designer only needs to design RPMC circuit modules, it is possible to reduce the complexity of chip design, shorten the design period and reduce the cost.

2. The internal mutual communication between the SPI FLASH and the RPMC can be achieved through a pair of mutually connected internal IO. Thus, when either one of the SPI FLASH and the RPMC is executing external instruction and the other one is idle, if a suspend instruction is received through the external sharing pins, then the one which is executing the external instruction will execute the suspend instruction and will send a notification of its suspension to other one which is idle through the pair of mutually connected internal IO pins, such that other one which is idle will also execute the suspend instruction, whereby ensuring the synchronization between the SPI FLASH and the RPMC.

3. The SPI FLASH and the RPMC may also execute different instructions simultaneously, that is, the SPI FLASH and the RPMC can be operated in parallel, in such a manner that, the performance of the chip could be improved.

4. The SPI FLASH and the RPMC made by different processes can be integrally packaged in a manner of multi-chip packaging, such that the existing resources can be reused so as to reduce the development cost.

5. The capacity of SPI FLASH is extendable; for example, the capacity of a single SPI FLASH could be increased or a plurality of SPI FLASH could be packaged integrally.

DETAILED DESCRIPTION OF PREFERRED EMBODIMENTS

Figure 1:
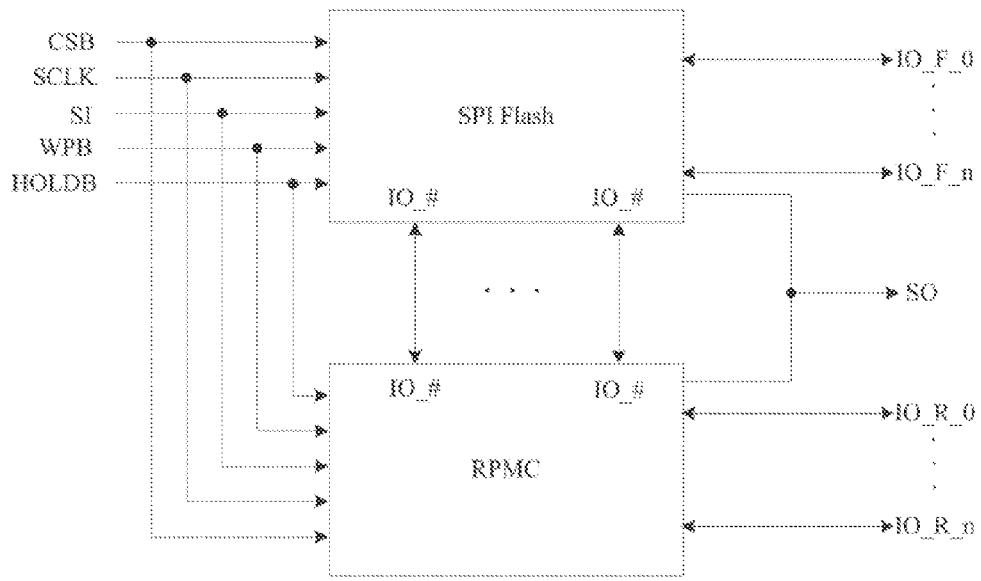
FIG. 1 is a schematic diagram showing the logical connection of the enhanced Flash chip of SPI interface according to a second embodiment of the present invention.

In order to more apparently understand the purposes, features and advantages of the present invention set forth herein, the detailed description thereof will be provided below in connection with the accompanying drawings and specific embodiments.

The embodiment of the present invention provides an enhanced Flash chip of SPI interface that is realized by a multi-chip package method. On the basis of SPI FLASH chip, the RPMC and the SPI FLASH chip are packaged integrally to hence constitute an enhanced Flash chip with RPMC function, in which the RPMC and the SPI FLASH are allowed to share common pin. The embodiment of the present invention may reduce the complexity and the cost of chip design. Further, the internal mutual communication between the SPI FLASH and the RPMC can be achieved through a pair of mutually connected internal IO pins, whereby ensuring the synchronization between the RPMC and the SPI FLASH.

The SPI is a high-speed, full-duplex and synchronous communication bus and occupies a small amount of pins of chip. Thus, it can save the pins of chip, and in turn save space and provide convenience for chip layout.

The SPI can operate in master-slave mode. In this operating mode, usually one master device and one or several slave device are provided, and at least 4 pins (or 3 pins in case of one-way transmission) are required. The required four pins are Serial Data Input (SI), Serial Data Output (SO), Serial Clock (SCLK,) Chip Select B (CSB), respectively. In the 4 pins;

(5) SI is used to input data into chip wherein the data is shifted in on the rising edge of clock;
(6) SO is used to output data out of chip wherein the data is shift out on the falling edge of clock;
(7) SCLK is used to shift in data on the rising edge of clock and shift out data on the falling edge; and
(8) CSB is used to input chip select signal into chip.

Herein, the CSB is the pin to control whether chip is selected or not. Only when the chip select signal is a predefined enable signal (high level or low level), the operation on the chip can be effective. Accordingly, it can be predefined to select the enable signal of SPI FLASH or the enable signal of RMPC.

Since the SPI conforms to a serial communication protocol, the data is transmitted bit by bit. This is the reason why the SCLK is required. The SCLK provides clock pulse, and the SI and the SO may realize the data transmission based on this clock pulse.

In a point-to-point communication, SPI interface does not need to perform addressing operation, the communication of which is full duplex, simple and efficient.

First Embodiment

The first embodiment of the present invention provides an enhanced Flash chip of SPI interface which may comprise: a SPI FLASH and a RPMC packaged integrally.

In this embodiment, the SPI FLASH and the RPMC may be independent chips. The SPI FLASH may be selected to have different capacity to satisfy the requirements of different systems. The SPI FLASH can reuse designed SPI FLASH chips and hence there is no need to be redesigned, greatly reducing the design period; the RPMC is provided with the function of replay protection monotonic counter and thus can be used independently.

In the enhanced Flash chip of SPI interface provided in this embodiment of the present invention, the SPI FLASH and the RPMC can comprise an independent controller, respectively. In response to an external instruction, the SPI FLASH and the RPMC may control SPI FLASH and RPMC to receive and decode by the independent controller, respectively. If the decoding is completed, a corresponding operation will be executed.

In addition, the SPI FLASH and the RPMC may have the same IO (Input/Output) pins which may be connected mutually and be connected to the same external sharing pins of the chip. The external sharing pins may comprise: a chip select (CSB), a serial clock (SCLK), a serial data input (SI), a write protection (WPB), an external instruction shield (HOLDB) and a serial data output (SO), wherein, the CSB, SCLK, SI and SO are pins of SPI interface and the WPB and HOLDB are extended pins of SPI interface. Herein, the CSB, SCLK. SI and SO are four required pins of SPI interface. In this embodiment of the present invention, the same IO pins in SPI FLASH and RPMC may refer to IO pins with same functions. For example, an IO pin CE in the SPI FLASH can realize the function of SPI interface and an IO pin CSE in the RPMC can realize the function of SPI interface, so that the IO pin CE in the SPI FLASH and the IO pin CSE in the RPMC may be the same IO pin and mutually connected.

An external instruction may be transmitted to the SPI FLASH and the RPMC through CSB, SCLK and SI of the external sharing pins of the chip, and then the controller of SPI FLASH and the controller of RPMC may judge whether to execute the external instruction respectively and may control the SPI FLASH and the RPMC to execute corresponding operations according to the judgment result.

In this embodiment of the present invention, the SPI FLASH and the RPMC may further comprise internal IO pins, respectively. The internal IO pins of the SPI FLASH and the internal IO pins of the RPMC may be mutually connected, such that the internal mutual communication between the SPI FLASH and the RPMC can be achieved through a pair of mutually connected internal IO pins, whereby ensuring the synchronization between the SPI FLASH and the RPMC.

Herein, the mutual connection between the internal IO pins of the SPI FLASH and the RPMC may be realized by mutually connecting the internal IO pins indicating the same status bit in the SPI FLASH and the RPMC.

For example, the internal IO pin IO_0 of SPI FLASH is used to output a status bit "busy" and the internal IO pin IO-2 of RPMC is used to input the status bit "busy". Thus, the internal IO pin IO_0 of SPI FLASH and the internal IO pin IO_2 of RPMC may be mutually connected, such that the IO_0 and the IO_2 is a pair of mutually connected internal IO pins. After being mutually connected, the SPI FLASH may output its status bit "busy" to the internal IO pin IO_2 of RPMC through its internal IO pin IO_0, such that the RPMC may obtain the current status of SPI FLASH.

As another example, the internal IO pin IO_1 of SPI FLASH is used to input the status bit "busy" and the internal IO pin IO_3 of RPMC is used to output the status bit "busy". Thus, the internal IO pin IO_1 of SPI FLASH and the internal IO pin IO_3 of RPMC may be mutually connected, such that the IO_1 and the IO_3 is a pair of mutually connected internal IO pins. After being mutually connected, the RPMC may output its status bit "busy" to the internal IO pin IO_1 of SPI FLASH through its internal IO pin IO_3, such that the SPI FLASH may obtain the current status of RPMC.

The enhanced Flash chip of SPI interface will be further described in detail in the following embodiments.

In this embodiment of the present invention, since the SPI FLASH and the RPMC are packaged integrally, the package size and design cost can be reduced. Moreover, since the existing SPI FLASH chips can be reused as the circuit modules of SPI FLASH and the designer only needs to design RPMC circuit modules, it is possible to reduce the complexity of chip design, shorten the design period and reduce the cost. Moreover, the internal mutual communication between the SPI FLASH and the RPMC can be achieved through a pair of mutually connected internal IO pins, whereby ensuring the synchronization between the SPI FLASH and the RPMC.

Second Embodiment

Hereafter, the enhanced Flash chip of SPI interface according to the second embodiment of the present invention will be explained in detail.

FIG. 1 shows a schematic diagram of the logical connection of the enhanced Flash chip of SPI interface according to a second embodiment of the present invention.

As shown in FIG. 1, the enhanced Flash chip of SPI interface according to the embodiment of the present invention may comprise a SPI FLASH and a RPMC which are packaged integrally.

Herein, the SPI FLASH and the RPMC each comprises a plurality of pins, and the same IO pins in the RPMC and the SPI FLASH may be connected to the same set of external sharing pins. The RPMC and the SPI FLASH may receive an instruction from outside simultaneously response correspondingly. The SPI FLASH and the RPMC may further comprise internal IO pins, respectively, such that the internal IO pins of SPI FLASH and the internal IO pins of RPMC are mutually connected. The RPMC and the SPI FLASH may also be provided with independent IO pins, respectively. When the two chips are packaged integrally, the SPI FLASH having RPMC function may be realized.

In this embodiment of the present invention, the pins of the chips may be involved in the following three types.

1. External Sharing Pin

In this embodiment of the present invention, the SPI FLASH and the RPMC have the same IO pins, such that the same IO pins in the SPI FLASH and the RPMC may be connected mutually and be connected to the same external sharing pins of the chip. A plurality of the external sharing pins may be provided.

For example, CSB, SCLK, SI and SO in FIG. 1 are the external sharing SPI interfaces of the chip. Also, the write protection (WPB) and the external instruction shield (HOLDB) are the additional external sharing interfaces according to the functions of the chip. IO interfaces of SPI FLASH connected to CSB, SCLK, SI, SO, WPB and HOLDB and IO interfaces of RPMC connected to CSB, SCLK, SI, SO, WPB and HOLDB are the same IO interfaces in the SPI FLASH and the RPMC.

It should be explained that, since FIG. 1 is the schematic diagram of the logical connection of chip, the CSB, SCLK, SI, SO, WPB and HOLDB therein are all referred to as interfaces. These interfaces in the diagram of the logical connection are in turn referred to as pins in physical connection of chip.

In this embodiment of the present invention, the SPI FLASH and the RPMC each comprises an independent controller. An external instruction may be transmitted to the SPI FLASH and the RPMC through CSB, SCLK and SI of the external sharing pins of the chip, and the controller of SPI FLASH and the controller of RPMC judge whether to execute the external instruction, respectively.

Preferably, when the chip receives an external instruction through the external sharing pins, the following processes can be executed:

First, when the chip receives a first external instruction through CSB, SCLK and SI of the external sharing pins, if the controller of SPI FLASH and the controller of RPMC judge that the SPI FLASH and the RPMC both are required to execute the first external instruction, respectively, then the SPI FLASH and the RPMC will execute corresponding operation according to the first external instruction, respectively.

For example, if an external instruction a is transmitted to the SPI FLASH and the RPMC through the external sharing pins CSB, SCLK and SI, then each of the controller of SPI FLASH and the controller of RPMC may judge whether to execute the external instruction respectively according to the external instruction a. If the controller of SPI FLASH judges that the SPI FLASH is required to execute the external instruction a and the controller of RPMC judges that the RPMC is not required to execute the external instruction a, then the SPI FLASH may execute the operation corresponding to the external instruction a according to the external instruction a.

If an external instruction b is transmitted to the SPI FLASH and the RPMC through the external sharing pins CSB, SCLK and SI, then each of the controller of SPI FLASH and the controller of RPMC may judge whether to execute the external instruction respectively according to the external instruction b. If the controller of SPI FLASH judges that the SPI FLASH is not required to execute the external instruction b and the controller of RPMC judges that the RPMC is required to execute the external instruction b, then the RPMC may execute the operation corresponding to the external instruction b according to the external instruction b.

If an external instruction c is transmitted to the SPI FLASH and the RPMC through the external sharing pins CSB, SCLK and SI, then each of the controller of SPI FLASH and the controller of RPMC may judge whether to execute the external instruction respectively according to the external instruction c. If the controller of SPI FLASH judges that the SPI FLASH is required to execute the external instruction c and the controller of RPMC judges that the RPMC is also required to execute the external instruction c, then the SPI FLASH and the RPMC may both execute the operation corresponding to the instruction c according to the external instruction c.

Second, if either one of the SPI FLASH and the RPMC is required to execute the first external instruction, then when one of the SPI FLASH and the RPMC executes corresponding operation according to the first external instruction, if the chip receives a second external instruction through the external sharing pins which needs to be executed by the other one of the SPI FLASH and the RPMC, then the other one of the SPI FLASH and the RPMC will execute corresponding operation according to the second external instruction.

For example, if the controller of SPI FLASH judges that the SPI FLASH is required to execute the external instruction a and the controller of RPMC judges that the RPMC is not required to execute the external instruction a, then the SPI FLASH may execute the operation corresponding to the external instruction a according to the external instruction a. When the SPI FLASH executes the external instruction a, if an external instruction d is transferred to the SPI FLASH and the RPMC through the external sharing pins CSB, SCLK and SI, respectively, the controller of SPI FLASH judges that the SPI FLASH is not required to execute the external instruction d and the controller of RPMC that RPMC is required to execute the external instruction d, then the RPMC may execute the operation corresponding to the instruction d according to the external Instruction d.

Similarly, if the controller of SPI FLASH judges that the SPI FLASH is not required to execute the external instruction b and the controller of RPMC judges that the RPMC is required to execute the external instruction b, then the RPMC may execute the operation corresponding to the instruction b according to the external instruction b.

When the RPMC executes the external instruction b, if an external instruction e is transmitted to the SPI FLASH and the RPMC through the external sharing pins CSB, SCLK and SI, respectively, the controller of SPI FLASH judges that the SPI FLASH is required to execute the external instruction e and the controller of RPMC judges that the RPMC is not required to execute the external instruction e, then the SPI FLASH may execute the operation corresponding to the external instruction e according to the external instruction e.

Preferably, a clock signal may be transmitted to the SPI FLASH and the RPMC through SCLK of the chip. The controller of SPI FLASH and the controller of RPMC may determine a clock cycle according to the clock signal, respectively.

A chip select signal may be transmitted to the SPI FLASH and the RPMC through CSB of the chip according to the determined clock cycle. A control instruction may be transmitted to the SPI FLASH and the RPMC through SI of the chip according to the determined clock cycle. The controller of SPI FLASH and the controller of RPMC may determine whether to execute the operation corresponding to the control instruction in the SPI FLASH and the RPMC according to the control instruction.

The write protection signal is transmitted to the SPI FLASH and the RPM through the WPB. The controller of SPI FLASH and the controller of RPMC may judge that the write protection signal is effective to both the SPI FLASH and the RPMC.

A suspend instruction is transmitted to the SPI FLASH and the RPMC through the CSB, SCLK and SI. The controller of SPI FLASH and the controller of RPMC may judge that the suspend instruction is effective to both the SPI FLASH and the RPMC.

Thus, through the aforementioned processes, the SPI FLASH and the RPMC may simultaneously execute the same or different instructions so as to realize in parallel executing the instructions by the SPI FLASH and the RPMC. For example, when the SPI FLASH executes a PROGRAM or ERASE, the RPMC may execute the instructions such as reading of status register, etc.

2. The Pair of Mutually Connected Internal IO Pins

In this embodiment of the present invention, the SPI FLASH and the RPMC further comprise internal IO pins, respectively. The internal IO pins of the SPI FLASH and the internal IO pins of the RPMC may be mutually connected, such that the internal mutual communication between the SPI FLASH and the RPMC can be achieved through a pair of mutually connected internal IO pins.

For example, in FIG. 1, the internal IO interface (i.e., pin) IO_# of the SPI FLASH and the internal IO interface IO_# of the RPMC may form a pair of mutually connected internal IO interfaces (i.e., a pair of mutually connected internal IO pins) of the chip. A plurality of the pairs of mutually connected internal IO interfaces may be provided, the internal mutual communication between the SPI FLASH and the RPMC may be achieved through the internal IO interface IO_# of SPI FLASH and the internal IO interface IO_# of RPMC which are mutually connected.

In this embodiment of the present invention, the internal mutual communication between the SPI FLASH and the RPMC can be achieved through a pair of mutually connected internal IO pins. For example, the internal IO pin IO_0 used to output the status bit "busy" in the SPI FLASH and the internal IO pin IO_2 used to input the status bit "busy" in the RPMC may be mutually connected; and the internal IO pin IO_1 used to input the status bit "busy" in SPI FLASH and the internal IO pin IO_3 used to output the status bit "busy" in the RPMC may also be mutually connected. IO_0 and IO_2 as well as IO_1 and IO_3 are the pairs of mutually connected internal IO pins, respectively.

Thus, the internal mutual communication between the SPI FLASH and the RPMC may be achieved through the pairs of mutually connected internal IO pins IO_0 and IO_2 as well as IO_1 and IO_3, such that one of pins may be informed of the status bit "busy" value of the other one of the pins.

Thus, when either one of the SPI FLASH and the RPMC is executing external instruction and the other one is idle, if a suspend instruction is received through the external sharing pins, then the one which is executing the external instruction will execute the suspend instruction and will send a notification of its suspension to the other one which is idle through the pair of mutually connected internal IO pins, such that the other one which is idle will also execute the suspend instruction, whereby ensuring the synchronization between the SPI FLASH and the RPMC.

Preferably, the processes of the synchronization between the SPI FLASH and the RPMC may comprise:

When the SPI FLASH is executing an external instruction and the RPMC is idle, if the chip receives a suspend instruction through the external sharing pins, then the controller of the SPI FLASH may judge that the SPI FLASH is required to execute the suspend instruction, and the controller of the mentioned RPMC may judge that the RPMC is not required to execute the suspend instruction.

After suspending the operation being executed according to the suspend instruction, the SPI FLASH may send a notification of its suspension to the RPMC through the pair of mutually connected internal IO pins. After receiving the notification, the RPMC may also execute the suspend instruction to realize synchronization with the SPI FLASH.

Or, when the RPMC is executing an external instruction and the SPI FLASH is idle, if the chip receives a suspend instruction through the external sharing pins, then the controller of the SPI FLASH may judge that the SPI FLASH is not required to execute the suspend instruction, the controller of the RPMC may judge that RPMC is required to execute the suspend instruction.

After suspending the operation being executed according to the suspend instruction, the RPMC may send a notification of its suspension to the SPI FLASH through a pair of mutually connected internal IO pins. After receiving the notification, the SPI FLASH also execute the suspend instruction to realize synchronization with the RPMC.

For example, the SPI FLASH is in a "busy" state, and the RPMC is in an "idle" state. When the chip receives an external instruction A through the external sharing pins, the controller of SPI FLASH judges that the SPI FLASH is required to execute the external instruction A and the controller of RPMC judges that the RPMC is not required to execute the external instruction A. In this case, the SPI FLASH may execute the corresponding operation according to the external instruction A, the status bit "busy" of the SPI FLASH which is executing the external instruction A is set to 1, and the status bit "busy" of the RPMC which is in idle state is set to 0.

At this point, if the chip receives a suspend instruction through the external sharing pins, since the SPI FLASH is in a busy state and the RPMC is in an idle state, the controller of SPI FLASH judges that the SPI FLASH is required to execute the suspend instruction and the controller of RPMC judges that the RPMC is not required to execute the suspend instruction; and then the SPI FLASH may suspend the operation being executed according to the suspend instruction.

After suspending the operation being executed according to the suspend instruction, the SPI FLASH may send a notification of its suspension to the RPMC through a pair of mutually connected internal IO pins. The RPMC obtains that the SPI FLASH in a state of busy=1 has suspended after receiving the notification, such that the RPMC may execute the suspend instruction so as to realize synchronization with the SPI FLASH.

The SPI FLASH is in an idle state, and the RPMC is in a busy state.

When the chip receives an external instruction B through the external sharing pins, the controller of SPI FLASH judges that the SPI FLASH is not required to execute the external instruction B and the controller of RPMC judges that the RPMC is required to execute the external instruction B. In this case, the RPMC may execute the operation corresponding to the instruction B according to the external instruction B3, the status bit "busy" of the RPMC which is executing the external instruction B is set to 1, and the status bit "busy" of the SPI FLASH which is in idle state is set to 0.

At this point, if the chip receives a suspend instruction through the external sharing pins, since the SPI FLASH is an idle state and the RPMC is in a busy state, the controller of SPI FLASH judges that the SPI FLASH is not required to execute the suspend instruction and the controller of RPMC judges that the RPMC is required to execute the suspend instruction; and then the RPMC may suspend the operation being executed according to the suspend instruction.

After suspending the operation being executed according to the suspend instruction, the RPMC may send a notification of its suspension to the SPI FLASH through a pair of mutually connected internal IO pins. The SPI FLASH obtains that the RPMC in a state of busy=1 has suspended after receiving the notification, such that the SPI FLASH may execute the suspend instruction so as to realize synchronization with the RPMC.

However, if there is no pair of mutually connected internal IO pins in the chip, then the suspended SPI FLASH cannot inform the RPMC (or the suspended RMPC cannot inform the SPI FLASH). Thus, after receiving the suspend instruction, the RPMC (or the SPI FLASH) in an idle state may ignore the instruction, which may result in that RPMC still executes subsequently received instructions. However, the SPI FLASH (or the RPMC) cannot execute subsequently received instruction due to its suspension, causing an asynchronous problem between the SPI FLASH and the RPMC.

Moreover, if each of the SPI FLASH and the RPMC is in a busy state (that is, each of the SPI FLASH and the RPMC is executing the corresponding operations according to the external instruction), then, if the chip receives a suspend instruction through the external sharing pins, the controller of SPI FLASH judges that the SPI FLASH is required to execute the suspend instruction and the controller of RPMC judges that the RPMC is also required to execute the suspend instruction. Each of the SPI FLASH and the RPMC may suspend the operation being executed according to the suspend instruction, and send a notification of its suspension to each other through the pair of mutually connected internal IO pins.

3. External Independent Pins

In this embodiment of the present invention, the external independent pins in the chip may be involved in the following two types.

(1) External Independent Pins Related to SPI FLASH

In this embodiment of the present invention, the SPI FLASH further comprises an independent IO pin connected with the SPI FLASH to realize its function. The independent IO pin connected with SPI FLASH i connected to the external independent pins of the chip (that is, the external independent pins related to SPI FLASH).

For example, in FIG. 1, $IO\_F\_0, \ldots, IO\_F\_0$ are the external independent interfaces (i.e., pins) in the chip related to SPI FLASH, and the IO interfaces in the SPI FLASH connected with the $IO\_F\_0, \ldots, IO\_F\_0$ are the independent IO interfaces connected with the SPI FLASH.

In this embodiment of the present invention, an external instruction may be transmitted to the SPI FLASH through the external independent pins in the chip related to SPI FLASH. The controller of SPI FLASH may judge whether SPI FLASH is required to execute the external instruction. If required, the SPI FLASH may execute the corresponding operation according to the external instruction.

(2) External Independent Pins Related to RPMC

In this embodiment of the present invention, the RPMC further comprises an independent IO pin connected with RPMC to realize its function. The independent IO pin connected with RPMC is connected to another external independent pin of the chip (that is, the external independent pins related to RPMC).

For example, in FIG. 1, $IO\_R\_0, \ldots, IO\_R\_0$ are the external independent interfaces (i.e., pins) in the chip related to RPMC, and the IO interfaces in the RPMC connected with $IO\_R\_0, \ldots, IO\_R\_0$ are the independent IO interfaces connected with the RPMC.

In this embodiment of the present invention, an external instruction may be transmitted to the RPMC through the external independent pins in the chip related to RPMC. The controller of RPMC may judge whether RPMC is required to execute the external instruction. If required, the RPMC may execute the corresponding operation according to the external instruction.

In (1) External independent pins related to SPI FLASH and (2) External independent pins related to RPMC set forth herein, the independent IO pin connected with SPI FLASH and the independent IO pin connected with RPMC is not mutually connected.

Figure 2:
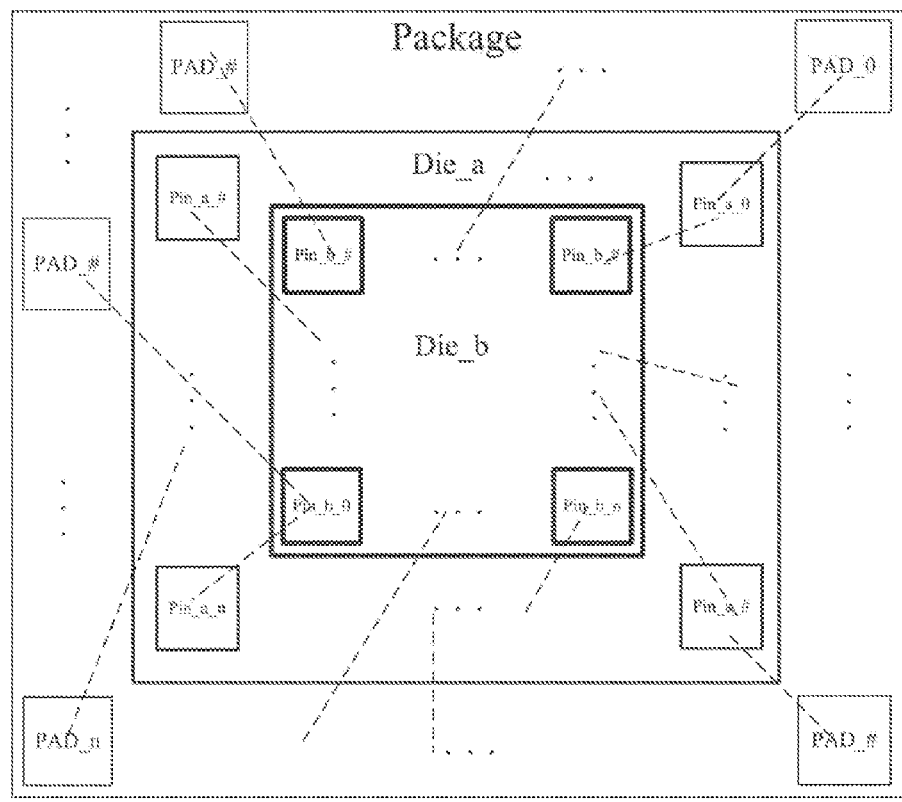
FIG. 2 is a diagram showing the packaging principle of the enhanced Flash chip of SPI interface according to a second embodiment of the present invention.

Hereafter, the connection between various pins will be explained in conjunction with FIG. 2. FIG. 2 is a diagram showing the packaging principle of the enhanced Flash chip of SPI interface according to a second embodiment of the present invention.

In FIG. 2, Package indicates a package, Die_a indicates SPI FLASH and Die_b indicates RPMC. The size of SPI FLASH is larger than that of RPMC. In FIG. 2, PAD_0, . . . , PAD_#, . . . , PAD_n are SPI pins or IO pins of the chip, which comprise the external sharing pins and the external independent pins; Pin_a_0, . . . , Pin_a_#, . . . , Pin_a_n are IO pins of SPI FLASH which comprise the same IO pins as those of RPMC, the independent IO pins connected with SPI FLASH to realize its functions and the internal IO pins of SPI FLASH; Pin_b_0, . . . , Pin_b_#, . . . , Pin_b_n are IO pins of RPMC, which comprise the same IO pins as those of SPI FLASH, the independent IO pins connected with RPMC to realize its functions and the internal IO pins of RPMC. Herein, # indicates any number between 0 and n.

I. Connection of External Sharing Pin

In this embodiment of the present invention, the same IO pin in the SPI FLASH and the RPMC is mutually connected and are connected to the same external sharing pins of the chip. The connection may comprise:

An IO pin a_x of the SPI FLASH is connected with the same IO pin b_y of the RPMC (the IO pin a_x of SPI FLASH have the same function as the IO pin b_y of RPMC), and the IO pin a_x of the SPI FLASH is connected to the same external sharing pin PAD_z of the chip.

For example, at the upper right in FIG. 2, Pin_a_0 (that is a_x, x=0) and Pin_b_# (that is, b_y, y=#) are mutually connected, and Pin_a_0 is connected to the same external sharing pin PAD_0 of the chip (that is PAD_z, z=0). At the lower right in FIG. 2, Pin_a_# (that is, a_x, x=#) is connected with the same IO pin of RPMC, and Pin_a_# is connected to the same external sharing pin PAD_# of the chip (that is PAD_z, z=#). Described above are two situations of the connection of external sharing pins. Or, the IO pin a_x of the SPI FLASH is connected with the same IO pin b_y of the RPMC, and the same IO pin b_y of the RPMC is connected to the same external sharing pin PAD_z of the chip.

For example, in FIG. 2, Pin_a_n (that is, a_x, x=n) and Pin_b_0 (that is, b_y, y=0) are mutually connected, and Pin_b_0 is connected to the same external sharing pin PAD_# (that is, PAD_z, z=#). Described above is a situation of the connection of external sharing pin.

Herein, "a" indicates an IO pin of SPI FLASH, "x" indicates an IO pin mark of SPI FLASH, x=0, 1, . . . , n; "b" indicates an IO pin of RPMC, "y" indicates an IO pin mark of RPMC, y=0, 1, . . . , n; and "PAD" indicates IO pin of chip package, "z" indicates IO pin mark of chip package, z=0, 1, . . . , n.

II. Connection of the Pair of Internal IO Pins

An internal IO pin of the SPI FLASH and an internal IO pin of the RPMC are mutually connected. The connection may comprise: an internal IO pin a_x of the SPI FLASH is connected to an internal IO pin b_y of the RPMC. Herein, the internal IO pin a_x of SPI FLASH and the internal IO pin b_y of RPMC may indicate the same status bit. For example, the pin a_x of SPI FLASH is used to output the status bit and the pin b_y of RPMC is used to input the status bit; or, the pin a_x in SPI FLASH is used to input the status bit and the pin b_y of RPMC is used to output the status bit.

For example, in FIG. 2, Pin_a_# (that is, a_x, x=#) and the internal IO pin in RPMC are mutually connected, and Pin_b_n (that is, b_y, y=n) and the internal IO pins in SPI FLASH are mutually connected. Described above are two situations of the mutual connection between the internal IO pin of SPI FLASH and the internal IO pin of RPMC.

III. Connection of External Independent Pin (i) The independent IO pin connected with the SPI FLASH is connected to the external independent pin of the chip. The connection may comprise: an IO pin a_x of the SPI FLASH is connected to an external independent pin PAD_z of the chip.

For example, at the lower left in FIG. 2, an independent IO pin a_x connected with the SPI FLASH is connected to an external independent pin PAD_n of the chip (that is, PAD_z, z=n).

(ii). The independent IO pin connected with the RPMC is connected to another external independent pin of the chip. The connection may comprise: an IO pins b_y of the RPMC is connected to an external independent pin PAD_z of the chip.

For example, in FIG. 2, the independent IO pin Pin_b_# (that is, b_y, y=#) connected with the RPMC is connected to the external independent pin PAD_# of the chip (that is, PAD_z, z=#).

Moreover, PAD_0, PAD_1 . . . PAD_# . . . PAD_n in FIG. 2 may be external sharing pins or external independent pins.

Detailed description of connection of remainder pins in FIG. 2 will be omitted in this embodiment of the present invention.

Finally, it should be explained that although the SPI FLASH and the RPMC in FIG. 2 are packaged in vertical stack, in the chip, the SPI FLASH and the RPMC can also be packaged side by side. The embodiment of the present invention should not be limited thereto. Moreover, when the SPI FLASH and the RPMC are packaged in vertical stack, if the size of the SPI FLASH is larger than that of the RPMC, then the RPMC will be vertically stacked on the SPI FLASH; if the size of the RPMC is larger than that of the SPI FLASH, the SPI FLASH will be vertically stacked on the RPMC. That is, in FIG. 2, it is also feasible that Die_a is the RPMC and Die_b is the SPI FLASH.

The embodiment of the present invention provides an enhanced Flash chip of SPI interface that is realized by a multi-chip package method. On the basis of SPI FLASH chip, RPMC and SPI FLASH chip are packaged integrally to hence constitute an enhanced Flash chip with RPMC function, in which the RPMC and the SPI FLASH are allowed to share the common pin. The embodiment of the present invention may reduce the complexity and the cost of chip design. Further, the internal mutual communication between the SPI FLASH and the RPMC can be achieved through a pair of mutually connected internal IO pins, whereby ensuring the synchronization between the RPMC and the SPI FLASH. Moreover, in the embodiment of the present invention, the SPI FLASH and the RPMC may also execute different instructions simultaneously, that is, the SPI FLASH and the RPMC can be operated in parallel, in such a manner that the performance of the chip could be improved.

Third Embodiment

Hereafter, the specific method for packaging the chip will be explained by way of the third embodiment of the present invention.

Figure 3:
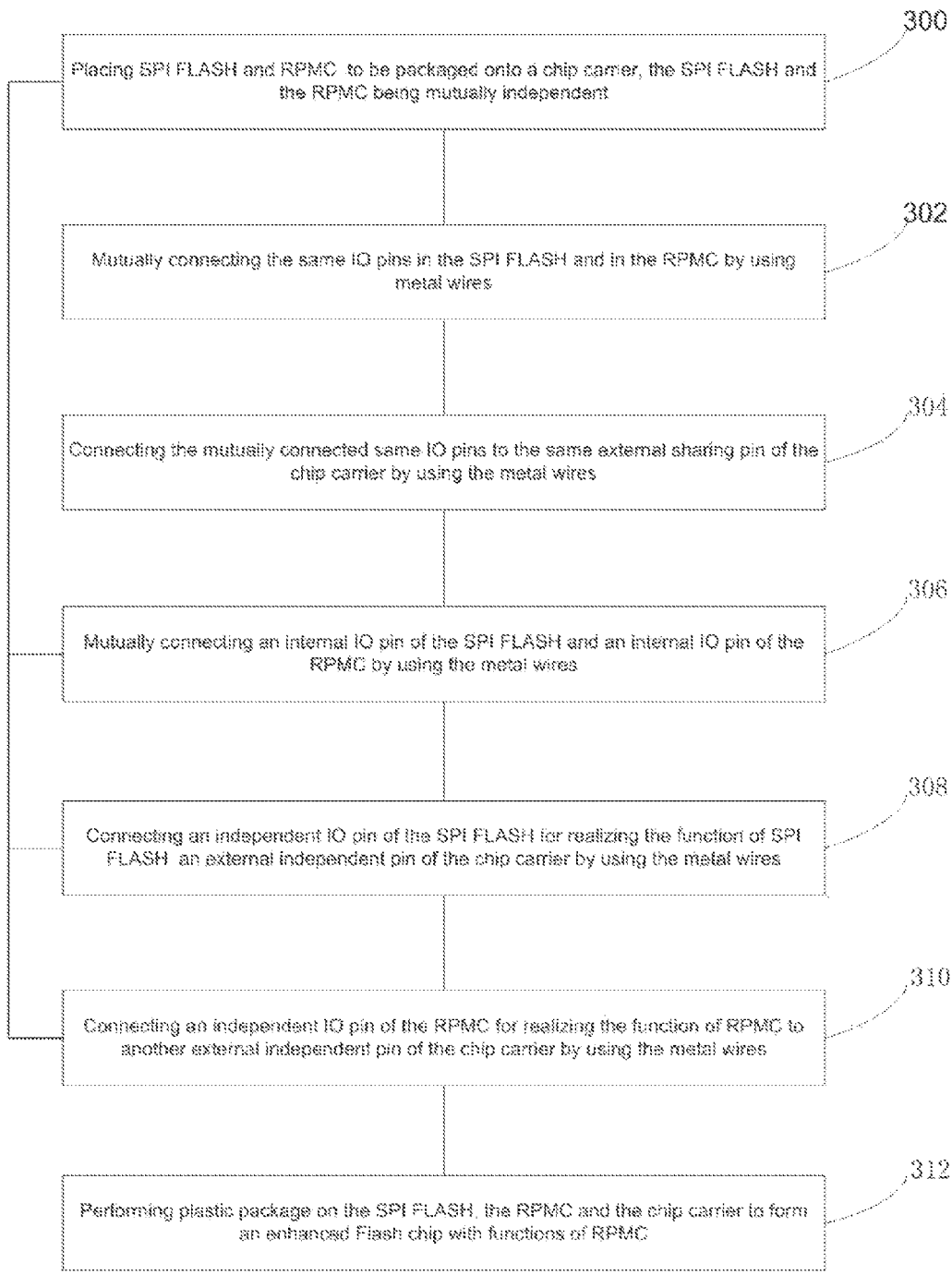
FIG. 3 is a flow chart of the method for packaging chip according to a third embodiment of the present invention.

FIG. 3 shows a flow chart of the method for packaging chip according to a third embodiment of the present invention. The packaging method may comprise steps of:

Step 300: placing SPI FLASH and RPMC to be packaged onto a chip carrier, the SPI FLASH and the RPMC being mutually independent.

In this embodiment of the present invention, the SPI FLASH and the RPMC are substantially packaged integrally so as to realize the enhanced Flash chip of SPI interface wherein the SPI FLASH and the RPMC are mutually independent.

First, the SPI FLASH and the RPMC to be packaged may be placed onto the chip carrier. The chip carrier in this embodiment of the present invention may correspond to Package in FIG. 2.

Preferably, Step 300 may comprise: placing the SPI FLASH and the RPMC onto the chip carrier side by side, or vertically stacking the SPI FLASH and the RPMC on the chip carrier.

FIG. 2 shows the packaging principle of vertically stacking the SPI FLASH and the RPMC on the chip carrier.

In this embodiment of the present invention, when the SPI FLASH and the RPMC are vertically stacked on the chip carrier, if the size of the SPI FLASH is larger than that of the RPMC, then the RPMC would be vertically stacked on the SPI FLASH; or if the size of the RPMC is larger than that of the SPI FLASH, then the SPI FLASH would be vertically stacked on the RPMC.

Step 302: mutually connecting the same IO pins in the SPI FLASH and in the RPMC by using metal wires.

In this embodiment of the present invention, there are some same IO pins (same functions) in the SPI FLASH and the RPMC, which could be mutually connected by using the metal wires. Particularly, the IO pin a_x of the SPI FLASH could be connected with the same IO pin b_y in the RPMC by using the metal wires.

Step 304: connecting the mutually connected same IO pins to the same external sharing pin of the chip carrier by using the metal wires.

The external sharing pin may comprise: a chip select (CSB), a serial clock (SCLK), a serial data input (SI) and a serial data output (SO), wherein the CSB, SCLK, SI and SO are pins of the SPI interface.

Further, the external sharing pin can comprise: a write protection (WPB), an external instruction shield (HOLDB), etc, wherein the WPB and HOLDB are extended pins of the SPI interface.

Preferably, Step 304 may comprise: connecting an IO pin a_x of the SPI FLASH to the same external sharing pin PAD_z of the chip carrier by using the metal wires, or connecting the same IO pin b_y of the RPMC to one external sharing pin PAD-z of the chip carrier by using the metal wires.

Herein, the IO pin a_x of the SPI FLASH and the IO pin b_y of the RPMC are the mutually connected same IO pins.

Herein, "a" indicates an IO pin of SPI FLASH, "x" indicates an IO pin mark of SPI FLASH; "b" indicates an IO pin of RPMC and "y" indicates an IO pin mark of RPMC; "PAD" indicates an IO pin of chip package and "z" indicates an IO pin mark of chip package.

The aforementioned Step 302-Step 304 can be combined to be a situation of the connection of external sharing pins. For example, at the upper right in FIG. 2, Pin_a_0 (that is a_x, x=0) and Pin_b_# (that is, b_y, y=#) are mutually connected, Pin_a_0 is connected to the same external sharing pin PAD_0 of the chip (that is, PAD_z, z=0); at the lower right in FIG. 2, Pin_a_# (that is, a_x, x=#) and the same IO pins in RPMC are mutually connected. Pin_a_# is connected to the same external sharing pin PAD_# of the chip (that is PAD_z, z=#); and in FIG. 2, Pin_a_n (that is, a_x, x=n) and Pin_b_0 (that is, b_y, y=0) are mutually connected, and Pin_b_0 is connected to the same external sharing pin PAD_# (that is, PAD_z, z=#). Described above are the situations of the connection of external sharing pins.

The dotted lines for connecting two pins in FIG. 2 represent the metal wires in this embodiment of the present invention.

Step 306: mutually connecting an internal IO pin of the SPI FLASH and an internal IO pin of the RPMC by using the metal wires.

In this embodiment of the present invention, the SPI FLASH and the RPMC can further comprise internal IO pins, respectively, and the internal IO pin a_x of SPI FLASH may be connected to the internal IO pin b_y of the RPMC by using metal wires. Herein, the internal IO pin a_x of SPI FLASH and the internal IO pin b_y of RPMC may indicate the same status bit.

For example, in FIG. 2, Pin_a_# (that is, a_x, x=#) is connected with the internal IO pin of the RPMC, and Pin_b_n (that is, b_y, y=n) is connected with the internal IO pins of the SPI FLASH. Described above are two situations of the mutual connection between the internal IO pin of SPI FLASH and the internal IO pin of RPMC by using the metal wires.

Step 308: connecting an independent IO pin of the SPI FLASH for realizing the function of SPI FLASH to an external independent pin of the chip carrier by using the metal wires.

In this embodiment of the present invention, the SPI FLASH may further comprise the independent IO pins for realizing functions of SPI FLASH, which could be connected to the external sharing pins of the chip carrier by using metal wires.

For example, at the lower left in FIG. 2, the independent IO pin a_x connected with SPI FLASH is connected to the external independent pin PAD_n of the chip (that is, PAD_z, z=n).

Step 310: connecting an independent IO pin of the RPMC for realizing the function of RPMC to an external independent pin of the chip carrier by using the metal wires.

Similarly, the RPMC can further comprise the independent IO pins for realizing functions of RPMC, which could be connected to the external sharing pins of the chip carrier by using metal wires.

For example, in FIG. 2, the independent IO pin Pin_b_n (that is, b_y, y=n) connected with RPMC is connected to the external independent pin PAD_z of the chip.

Herein, the independent IO pin of the SPI FLASH is not connected with the independent IO pin of the RPMC.

Step 312: performing plastic package on the SPI FLASH, the RPMC and the chip carrier to form an enhanced Flash chip with functions of RPMC.

After Step 300 to Step 310, the placement of SPI FLASH and RPMC and the connections of various pins of the chip are completed. Finally, the plastic package is performed on the SPI FLASH, the RPMC and the chip carrier to form the enhanced Flash chip with functions of RPMC. After the plastic package, the package of chip is finished.

It should be explained that the steps in this embodiment of the present invention can be implemented according to a sequence of the serial number, or some of steps can be implemented in parallel or in other sequence. For example, Step 302, Step 306, Step 308 and Step 310 can be implemented simultaneously or in other sequence.

Fourth Embodiment

The present invention also provides a computer readable recording medium in which a program used to execute the method of claim 8 is recorded.

The computer readable recording medium comprises any mechanism used to store or carry information in a readable format by a computing device (for example, computer).

For example, the machine readable medium comprises read-only memory (ROM), random access memory (RAM), disc storage medium, optical storage medium, flash storage medium, electric, light, sound and other formats of transmitting signal (for example, carrier wave, infrared signal, digital signal, etc.), etc.

In summary, the embodiments of the present invention can comprise advantages as follows:

1. The enhanced Flash chip of SPI interface proposed by the embodiments of the present invention is to integrally package SPI FLASH and RPMC, wherein, the SPI FLASH circuit and the RPMC circuit comprise an independent controller, respectively; the same IO pins of the SPI FLASH and the RPMC are mutually connected, and connected to the same external sharing pin of the chip; the external sharing pin comprises: a chip select (CSB), a serial clock (SCLK), a serial data input (SI), a write protection B (WPB), an external instruction shield (HOLDB) and a serial data output (SO), in which the CSB, SCLK, SI and SO are pins of SPI interface, and the WPB and HOLDB are extended pins of SPI interface; an external instruction is transmitted to the SPI FLASH and the RPMC through CSB, SCLK and SI of the external sharing pins of the chip and the controller of SPI FLASH and the controller of RPMC judge whether to execute the external instruction, respectively; and the SPI FLASH and the RPMC further comprise an internal IO pin, respectively, in which the internal IO pin of the SPI FLASH is connected with the same internal IO pin of the RPMC, and the internal mutual communication between the SPI FLASH and the RPMC is achieved through the pair of mutually connected internal IO. In the embodiments of the present invention, since the SPI FLASH and the RPMC are packaged integrally, the package size and the design cost can be reduced; moreover, since the existing SPI FLASH chips can be reused as the circuit modules of SPI FLASH and the designer only needs to design RPMC circuit modules, it is possible to reduce the complexity of chip design, shorten the design period and reduce the cost.

2. The internal mutual communication between the SPI FLASH and the RPMC can be achieved through a pair of mutually connected internal IO. Thus, when either one of the SPI FLASH and the RPMC is executing external instruction and the other one is idle, if a suspend instruction is received through the external sharing pins, then the one which is executing the external instruction will execute the suspend instruction and will send a notification of its suspension to other one which is idle through the pair of mutually connected internal IO pins, such that other one which is idle will also execute the suspend instruction, whereby ensuring the synchronization between the SPI FLASH and the RPMC.

3. The SPI FLASH and the RPMC may also execute different instructions simultaneously, that is, the SPI FLASH and the RPMC can be operated in parallel, in such a manner that, the performance of the chip could be improved.

4. The SPI FLASH and the RPMC made by different processes can be integrally packaged in a manner of multi-chip packaging, such that the existing resources can be reused so as to reduce the development cost.

5. The capacity of SPI FLASH is extendable; for example, the capacity of a single SPI FLASH could be increased or a plurality of SPI FLASH could be packaged integrally.

Each embodiment in the specification is described step by step. Each embodiment only emphasizes the differences from other embodiments. Same or similar parts between various embodiments can refer to each other.

For the simply descriptive purpose, the aforementioned embodiment of the method has been described as a combination of a series of actions. However, the skilled in the art should understand that the present invention is not limited by the sequence of the described actions but some of steps can be implemented in other sequence or simultaneously according to the present invention. Further, the skilled in the art should also understand that the embodiments described in the specification are all preferred embodiments and the actions and modules involved in are not necessarily required in the present invention.

Finally, it also should be explained that, in the context, the relational terms such as first, second are used only to discriminate one entity or operation from another entity or operation rather than to necessarily require or imply the actual existence of any relation or sequence between these entities or actions. Moreover, the terms "comprise", "include" or any other similar variety are intended to cover all non-exclusive comprising, in order that the courses, methods, items or equipments comprising a series of factors shall encompass not only factors described herein but also other factors that are not listed explicitly, or further encompass the inherent factors of these courses, methods, items or equipments. Unless definitely specified, the factor defined by the wording "comprises one . . . " shall not exclude any other same factor in the courses, methods, items or equipments comprising the factor described herein.

The enhanced Flash chip of SPI interface and the method for packaging chips have been described in detail in the embodiments of the present invention. In the context, the specific examples are provided to describe the principle and the embodiments of the present invention. The descriptions of the embodiments as above are used only to help understanding the methods and main concept of the present invention; meanwhile, modifications may be made by an ordinary skilled in the art according to the concept of the present invention within the scope of specific embodiments and applications. Therefore, the contents of the specification should not be constructed as any limiting on the present invention.

The invention claimed is:

1. An enhanced Flash chip of SPI interface, comprising:
SPI FLASH and RPMC which are packaged integrally, wherein,
the SPI FLASH and the RPMC comprise an independent controller, respectively;
the same IO pins in the SPI FLASH and in the RPMC are mutually connected and are connected to the same external sharing pin of the chip, the external sharing pin comprising: a CSB, a SCLK, a SI, a WPB, a HOLDB and a SO, in which the CSB, SCLK, SI and SO are pins of SPI interface and the WPB and HOLDB are extended pins of SPI interface;
an external instruction is transmitted to the SPI FLASH and the RPMC through CSB, SCLK and SI of the external sharing pins of the chip and the controller of SPI FLASH and the controller of RPMC judge whether to execute the external instruction, respectively; and the SPI FLASH and the RPMC further comprise an internal IO pin, respectively, in which the internal IO pin of the SPI FLASH is connected with the same internal IO pin of the RPMC, and the internal mutual communication between the SPI FLASH and the RPMC is achieved through the mutually connected internal IO pins.

2. The enhanced Flash chip of SPI interface according to claim 1, wherein,
when the chip receives a first external instruction through CSB, SCLK and SI of the external sharing pins, if the controller of SPI FLASH and the controller of RPMC judge that the SPI FLASH and the RPMC both are required to execute the first external instruction, respectively, then the SPI FLASH and the RPMC execute a corresponding operation according to the first external instruction, respectively;
if either one of the SPI FLASH and the RPMC is required to execute the first external instruction, then when one of the SPI FLASH and the RPMC executes the corresponding operation according to the first external instruction, if the chip receives a second external instruction through the external sharing pins which needs to be executed by the other one of the SPI FLASH and the RPMC, then the other one of the SPI FLASH and the RPMC executes a corresponding operation according to the second external instruction.

3. The enhanced Flash chip of SPI interface according to claim 2, wherein,
when the SPI FLASH is executing the external instruction and the RPMC is idle, if the chip receives a suspend instruction through the external sharing pins, then the controller of the SPI FLASH judges that the SPI FLASH is required to execute the suspend instruction, the controller of the RPMC judges that RPMC is not required to execute the suspend instruction; and
after suspending the operation being executed according to the suspend instruction, the SPI FLASH sends a notification of its suspension to the RPMC through the pair of mutually connected internal IO pins, and after receiving the notification, the RPMC executes the suspend instruction to realize synchronization with the SPI FLASH.

4. The enhanced Flash chip of SPI interface according to claim 1, wherein,
when the SPI FLASH is executing the external instruction and the RPMC is idle, if the chip receives a suspend instruction through the external sharing pins, then the controller of the SPI FLASH judges that the SPI FLASH is required to execute the suspend instruction, the controller of the RPMC judges that RPMC is not required to execute the suspend instruction; and
after suspending the operation being executed according to the suspend instruction, the SPI FLASH sends a notification of its suspension to the RPMC through the pair of mutually connected internal IO pins, and after receiving the notification, the RPMC executes the suspend instruction to realize synchronization with the SPI FLASH.

5. The enhanced Flash chip of SPI interface according to claim 1, wherein,
a clock signal is transmitted to the SPI FLASH and the RPMC through SCLK of the chip, and the controller of SPI FLASH and the controller of RPMC determine a clock cycle according to the clock signal, respectively; and
a chip select signal is transmitted to the SPI FLASH and the RPMC through CSB of the chip according to the determined clock cycle, a control instruction is transmitted to the SPI FLASH and the RPMC through SI of the chip according to the determined clock cycle, and the controller of SPI FLASH and the controller of RPMC determine to execute process operation corresponding to the instruction in the SPI FLASH and the RPMC according to the control instruction, respectively.

6. The enhanced Flash chip of SPI interface according to claim 1, wherein,
the SPI FLASH further comprises an independent IO pin connected with the SPI FLASH to realize its function, and the independent IO pin connected with SPI FLASH is connected to the external independent pin of the chip; and
the RPMC further comprises an independent IO pin connected with RPMC to realize its function, and the independent IO pin connected with RPMC is connected to other external independent pin of the chip,
wherein, the independent IO pin connected with SPI FLASH the independent IO pin connected with RPMC is not mutually connected.

7. The enhanced Flash chip of SPI interface according to claim 1, wherein, the same IO pins of the SPI FLASH and the RPMC being mutually connected and being connected to the same external sharing pins of the chip, comprises:
an IO pin a_x of the SPI FLASH is connected with the same IO pin b_y of the RPMC and the IO pin a_x of the SPI FLASH is connected to the same external sharing pin PAD_z of the chip, or the same IO pin b_y of the RPMC is connected to the same external sharing pin PAD_z of the chip;
wherein, "a" indicates an IO pin of SPI FLASH, "x" indicates an IO pin mark of SPI FLASH; "b" indicates an IO pin of RPMC and "y" indicates an IO pin mark of RPMC; "PAD" indicates an IO pin of chip package and "z" indicates an IO pin mark of chip package.

8. The enhanced Flash chip of SPI interface according to claim 1, wherein,
a plurality of the pairs of m connected internal IO pins are provided; and
a plurality of the external independent pins of the chip are provided.

9. A method for packaging chip, comprising steps of:
placing SPI FLASH and RPMC to be packaged onto a chip carrier, the SPI FLASH and the RPMC being mutually independent;
mutually connecting the same IO pins in the SPI FLASH and in the RPMC by using metal wires;
connecting the mutually connected same IO pins to the same external sharing pin of the chip carrier using the metal wires, the external sharing pin comprising: a chip select CSB, a serial clock SCLK, a serial data input SI, a write protection WPB, an external instruction shield HOLDB and a serial data output SO, wherein the CSB, SCLK, SI and SO are pins of the SPI interface, and the WPB and HOLDB are extended pins of the SPI interface;
mutually connecting an internal IO pin of the SPI FLASH and an internal IO pin of the RPMC by using the metal wires; and
performing plastic package on the SPI FLASH, the RPMC and the chip carrier to form an enhanced Flash chip with functions of RPMC.

10. The method for packaging chip according claim 9, further comprising:
- connecting an independent IO pin of the SPI FLASH for realizing the function of SPI FLASH to an external independent pin of the chip carrier by using the metal wires; and
- connecting an independent IO pin of the RPMC for realizing the function of RPMC to another external independent pin of the chip carrier by using the metal wires,
- wherein, the independent IO pin of the SPI FLASH is not connected with the independent IO pin of the RPMC.

11. The method for packaging chip according to claim 10, wherein the step of connecting the mutually connected same IO pins to the same external sharing pin of the chip carrier by using the metal wires, comprises:
- connecting an IO pin a_x of the SPI FLASH to the same external sharing pin PAD_z of the chip carrier by using the metal wires, or connecting the same IO pin b_y of the RPMC to the same external sharing pin PAD-z of the chip carrier by using the metal wires,
- wherein, the IO pin a_x of the SPI FLASH and the IO pin b_y of the RPMC are the mutually connected same IO pins; and
- "a" indicates an IO pin of SPI FLASH, "x" indicates an IO pin mark of SPI FLASH; "b" indicates an IO pin of RPMC and "y" indicates IO pin mark of RPMC; "PAD" indicates an IO pin of chip package and "z" indicates an IO pin mark of chip package.

12. The method for packaging chip according to claim 10, wherein the step of placing SPI FLASH and RPMC to be packaged onto a chip carrier, comprises:
- placing the SPI FLASH and the RPMC onto the chip carrier side by side, or vertically stacking the SPI FLASH and the RPMC on the chip carrier;
- when the SPI FLASH and the RPMC are vertically stacked on the chip carrier,
- if the size of the SPI FLASH is larger than that of the RPMC, then the RPMC is vertically stacked on the SPI FLASH; and
- if the size of the RPMC is larger than of the SPI FLASH, the the SPI FLASH is vertically stacked on the RPMC.

13. The method for packaging chip according to claim 9, wherein the step of connecting the mutually connected same IO pins to the same external sharing pin of the chip carrier by using the metal wires, comprises:
- connecting an IO pin a_x of the SPI FLASH to the same external sharing pin PAD_z of the chip carrier by using the metal wires, or connecting the same IO pin b_y of the RPMC to the same external sharing pin PAD-z of the chip carrier by using the metal wires,
- wherein, the IO pin a_x of the SPI FLASH and the IO pin b_y of the RPMC are the mutually connected same IO pins; and
- "a" indicates an IO pin of SPI FLASH, "x" indicates an IO pin mark of SPI FLASH; "b" indicates an IO pin of RPMC and "y" indicates IO pin mark of RPMC; "PAD" indicates an IO pin of chip package and "z" indicates an IO pin mark of chip package.

14. The method for packaging chip according to claim 9, wherein the step of placing SPI FLASH and RPMC to be packaged onto a chip carrier, comprises:
- placing the SPI FLASH and the RPMC onto the chip carrier side by side, or vertically stacking the SPI FLASH and the RPMC on the chip carrier;
- when the SPI FLASH and the RPMC are vertically stacked on the chip carrier,
- if the size of the SPI FLASH is larger than that of the RPMC, then the RPMC is vertically stacked on the SPI FLASH; and
- if the size of the RPMC is larger than of the SPI FLASH, the the SPI FLASH is vertically stacked on the RPMC.

15. A computer readable recording medium in which a program used to execute the method according to claim 9 is provided.

* * * * *